US012683495B2

(12) United States Patent (10) Patent No.: US 12,683,495 B2
Tsuda et al. (45) Date of Patent: Jul. 14, 2026

(54) PULSED POWER SUPPLY APPARATUS

(71) Applicants: Mitsubishi Electric Corporation, Tokyo (JP); National University Corporation Nagaoka University of Technology, Nagaoka (JP)

(72) Inventors: Shingo Tsuda, Tokyo (JP); Taichiro Tamida, Tokyo (JP); Weihua Jiang, Niigata (JP); Taichi Sugai, Niigata (JP)

(73) Assignees: MITSUBISHI ELECTRIC CORPORATION, Tokyo (JP); NATIONAL UNIVERSITY CORPORATION NAGAOKA UNIVERSITY OF TECHNOLOGY, Nagaoka (JP)

( * ) Notice: Subject to any disclaimer, the term of this patent is extended or adjusted under 35 U.S.C. 154(b) by 194 days.

(21) Appl. No.: 18/702,825

(22) PCT Filed: Nov. 16, 2021

(86) PCT No.: PCT/JP2021/042105
§ 371 (c)(1),
(2) Date: Apr. 19, 2024

(87) PCT Pub. No.: WO2023/089666
PCT Pub. Date: May 25, 2023

(65) Prior Publication Data
US 2025/0007405 A1 Jan. 2, 2025

(51) Int. Cl.
*H02M 3/158* (2006.01)
*H03K 3/53* (2006.01)

(52) U.S. Cl.
CPC .............. *H02M 3/158* (2013.01); *H03K 3/53* (2013.01); *H02M 3/1584* (2013.01)

(58) Field of Classification Search
CPC ...... H02M 3/158; H02M 3/1584; H02M 3/18; H03K 3/53; H03K 3/57
See application file for complete search history.

(56) References Cited

U.S. PATENT DOCUMENTS

| | | | |
|---|---|---|---|
| 3,845,322 A | 10/1974 | Aslin | |
| 7,843,087 B2 | 11/2010 | Ryoo et al. | |
| 9,683,817 B1 * | 6/2017 | Camp | .................... H03K 3/537 |

FOREIGN PATENT DOCUMENTS

| | | | | |
|---|---|---|---|---|
| CN | 110971138 A | * | 4/2020 | ............ H02M 11/00 |
| JP | 2002-158386 A | | 5/2002 | |
| | (Continued) | | | |

OTHER PUBLICATIONS

Office Action issued Sep. 10, 2024 in Japanese Patent Application No. 2023-561958, 8 pages.

(Continued)

*Primary Examiner* — Crystal L Hammond
*Assistant Examiner* — Jonathan Walter Soileau
(74) *Attorney, Agent, or Firm* — XSENSUS LLP

(57) ABSTRACT

A pulsed power supply apparatus includes a plurality of first inductors arranged in a first column in series connection; a plurality of second inductors arranged in a second column in series connection; a plurality of capacitors; a plurality of negative-side switching elements; a plurality of positive-side switching elements; a first positive terminal switching element connected to a first inductor of the plurality of first inductors that is located at one end of the plurality of first inductors and to a first output terminal; and a first negative terminal switching element connected to a second inductor of the plurality of second inductors that is located at one end of the plurality of second inductors and to the first output terminal.

2 Claims, 7 Drawing Sheets

(56)        References Cited

FOREIGN PATENT DOCUMENTS

| JP | 2006-135947 | A | 5/2006 | | |
| JP | 2008-118837 | A | 5/2008 | | |
| JP | 2018-074615 | A | 5/2018 | | |
| WO | WO-2020164901 | A1 * | 8/2020 | ............ | H02M 3/158 |

OTHER PUBLICATIONS

International Search Report and Written Opinion mailed on Jan. 25, 2022, received for PCT Application PCT/JP2021/042105, filed on Nov. 16, 2021, 8 pages including English Translation.

* cited by examiner

PULSED POWER SUPPLY APPARATUS

CROSS-REFERENCE TO RELATED APPLICATION

The present application is based on PCT filing PCT/JP2021/042105, filed on Nov. 16, 2021, the entire contents of which are incorporated herein by reference.

FIELD

The present disclosure relates to a pulsed power supply apparatus using a Marx circuit.

BACKGROUND

Power supply apparatuses that generate high-voltage pulses are used, for example, in sterilization apparatuses utilizing discharge, water treatment apparatuses, laser oscillators, exhaust gas purification apparatuses, ozone generators, and extreme ultraviolet light sources. These apparatuses need to generate extremely high pulsed power instantaneously when releasing electrical energy called pulsed power in an extremely short time.

Problems with a gas discharge switch used in a pulsed power supply have been a short life and low stability. In recent years, a switching circuit using semiconductor devices has been used, enabling the generation of high-voltage pulses with short pulse widths without use of a compression circuit that performs time compression of pulse waveforms and allowing for a higher-frequency power supply.

For dielectric barrier discharge used in ozone generators or discharge excimer lamps, in particular, an alternating-current high-frequency power supply is required.

Pulse generation circuitry disclosed in Patent Literature 1 includes a first pulse generation unit that includes first Marx circuits using first switching elements as rectifier elements and generates a first pulsed voltage; a second pulse generation unit that includes second Marx circuits using second switching elements as rectifier elements and generates a second pulsed voltage with a voltage polarity different from the first pulsed voltage; and a pulse coupling unit that connects the first and second pulse generation units and includes third switching elements as rectifier elements, with a direction from the first pulse generation unit to the second pulse generation unit being a forward direction.

CITATION LIST

Patent Literature

Patent Literature 1: Japanese Patent Application Laid-open No. 2006-135947

SUMMARY OF INVENTION

Problem to be Solved by the Invention

No compact pulsed power supply apparatus has been provided to generate bipolar pulsed voltage, which is a problem.

The present disclosure has been made in view of the above, and an object of the present disclosure is to obtain a compact pulsed power supply apparatus capable of generating bipolar pulsed voltage.

Means to Solve the Problem

In order to solve the above-stated problem and achieve the object, a pulsed power supply apparatus according to the present disclosure includes a plurality of first inductors arranged in a first column in series connection; a plurality of second inductors arranged in a second column in series connection; a plurality of capacitors; a plurality of negative-side switching elements; and a plurality of positive-side switching elements. The pulsed power supply apparatus according to the present disclosure further includes a first positive terminal switching element connected to a first inductor of the plurality of first inductors that is located at one end of the plurality of first inductors and to a first output terminal; a first negative terminal switching element connected to a second inductor of the plurality of second inductors that is located at one end of the plurality of second inductors and to the first output terminal; a second positive terminal switching element connected to a first inductor of the plurality of first inductors that is located at an opposite end of the plurality of first inductors and to a second output terminal; a second negative terminal switching element connected to a second inductor of the plurality of second inductors that is located at an opposite end of the plurality of second inductors and to the second output terminal; and a direct-current power supply connected to the second positive terminal switching element and the second negative terminal switching element. An i-th capacitor of the plurality of capacitors is connected to a second end of a first inductor of the plurality of first inductors that is located in an i-th row of the first column and to a second end of a second inductor of the plurality of second inductors that is located in the i-th row of the second column. i is an integer greater than or equal to 1. An i-th negative-side switching element of the plurality of negative-side switching elements is connected to the second end of the first inductor of the plurality of first inductors that is located in the i-th row of the first column and to a first end of the second inductor of the plurality of second inductors that is located in the i-th row of the second column. An i-th positive-side switching element of the plurality of positive-side switching elements is connected to a first end of the first inductor of the plurality of first inductors that is located in the i-th row of the first column and to the second end of the second inductor of the plurality of second inductors that is located in the i-th row of the second column.

Effects of the Invention

The pulsed power supply apparatus according to the present disclosure has an effect of generating bipolar pulsed voltage while being compact.

DESCRIPTION OF EMBODIMENTS

With reference to the drawings, a detailed description is hereinafter provided of pulsed power supply apparatuses according to embodiments.

First Embodiment

Figure 1:
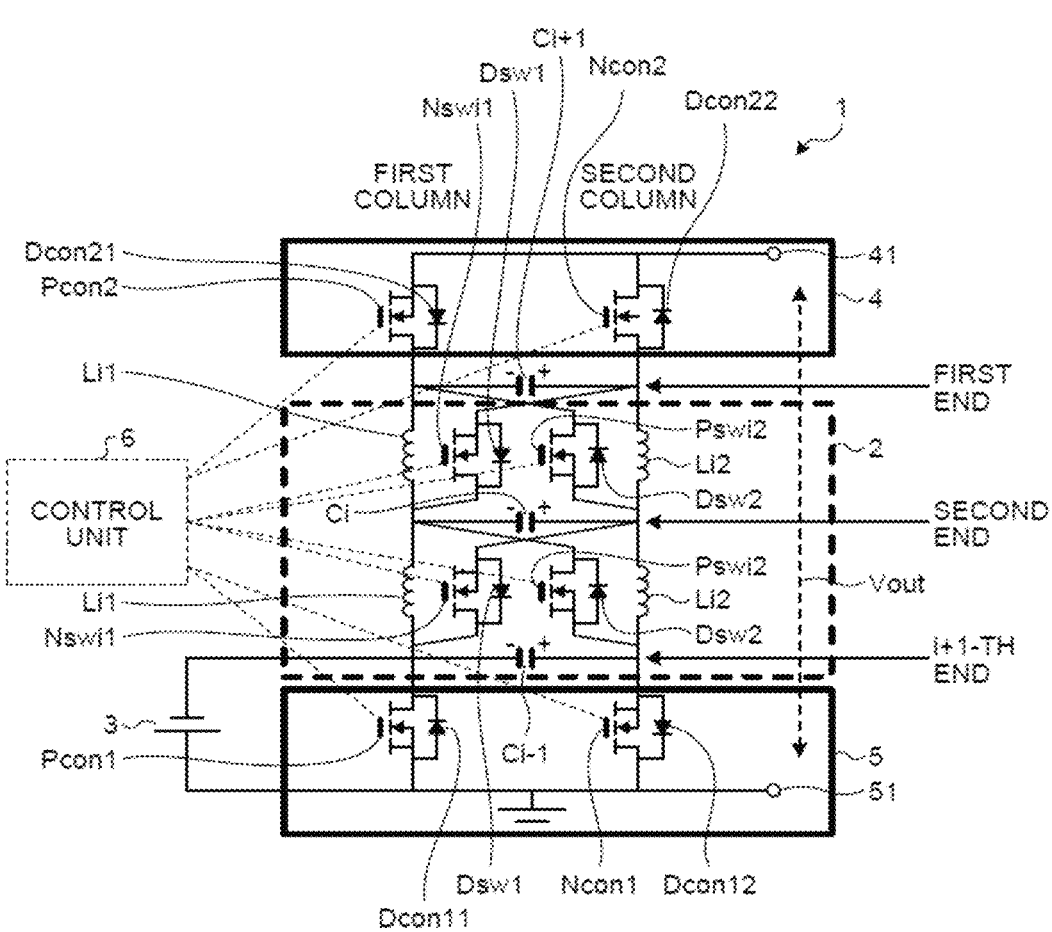
FIG. 1 is a diagram illustrating a configuration of a pulsed power supply apparatus according to a first embodiment.

FIG. 1 is a diagram illustrating a configuration of a pulsed power supply apparatus 1 according to a first embodiment. The pulsed power supply apparatus 1 includes a pulse generation unit 2, a direct-current power supply 3, a first positive-negative switching unit 4, a second positive-negative switching unit 5, and a control unit 6. The pulse generation unit 2 includes a plurality of capacitors. In FIG. 1, a capacitor $Ci-1$, a capacitor $Ci$, and a capacitor $Ci+1$ are illustrated as examples of the plurality of capacitors. i is an integer greater than or equal to 1.

The pulse generation unit 2 further includes a plurality of first inductors $Li1$ arranged in a first column in series connection and a plurality of second inductors $Li2$ arranged in a second column in series connection. The plurality of capacitors are connected in parallel via the plurality of first inductors $Li1$ and the plurality of second inductors $Li2$.

The pulse generation unit 2 further includes a plurality of negative-side switching elements $Nswi1$ and a plurality of positive-side switching elements $Pswi2$. An i-th negative-side switching element $Nswi1$ of the plurality of negative-side switching elements $Nswi1$ is connected to a second end of a first inductor $Li1$ of the plurality of first inductors $Li1$ that is located in an i-th row of the first column and to a first end of a second inductor $Li2$ of the plurality of second inductors $Li2$ that is located in the i-th row of the second column. An i-th positive-side switching element $Pswi2$ of the plurality of positive-side switching elements $Pswi2$ is connected to a first end of the first inductor $Li1$ of the plurality of first inductors $Li1$ that is located in the i-th row of the first column and to a second end of the second inductor $Li2$ of the plurality of second inductors $Li2$ that is located in the i-th row of the second column. The i-th negative-side switching element $Nswi1$ and the i-th positive-side switching element $Pswi2$ are located on opposite sides of the i-th capacitor $Ci$. The i-th capacitor $Ci$ is one of the plurality of capacitors included in the pulse generation unit 2.

The i-th capacitor $Ci$ of the plurality of capacitors included in the pulse generation unit 2 is connected to the second end of the first inductor $Li1$ of the plurality of first inductors $Li1$ that is located in the i-th row of the first column and to the second end of the second inductor $Li2$ of the plurality of second inductors $Li2$ that is located in the i-th row of the second column.

The pulse generation unit 2 further includes diodes $Dsw1$ respectively disposed in parallel with the plurality of negative-side switching elements $Nswi1$ and diodes $Dsw2$ respectively disposed in parallel with the plurality of positive-side switching elements $Pswi2$. The direct-current power supply 3 charges the plurality of capacitors with a voltage not exceeding withstand voltages of the plurality of capacitors and the plural switching elements.

In order for an alternating-current voltage to be generated, the first positive-negative switching unit 4 includes a first positive terminal switching element $Pcon2$ and a first negative terminal switching element $Ncon2$ that each correspond to an electric current direction. The first positive terminal switching element $Pcon2$ is connected to a first inductor $Li1$ of the plurality of first inductors $Li1$ that is located at one end of the plurality of first inductors $Li1$ and to a first output terminal 41. The first negative terminal switching element $Ncon2$ is connected to a second inductor $Li2$ of the plurality of second inductors $Li2$ that is located at one end of the plurality of second inductors $Li2$ and to the first output terminal 41. The first positive-negative switching unit 4 further includes a diode $Dcon21$ disposed in parallel with the first positive terminal switching element $Pcon2$ and a diode $Dcon22$ disposed in parallel with the first negative terminal switching element $Ncon2$.

In order for the alternating-current voltage to be generated, the second positive-negative switching unit 5 includes a second positive terminal switching element $Pcon1$ and a second negative terminal switching element $Ncon1$ that each correspond to the electric current direction. The second positive terminal switching element $Pcon1$ is connected to a first inductor $Li1$ of the plurality of first inductors $Li1$ that is located at an opposite end of the plurality of first inductors $Li1$ and to a second output terminal 51. The second negative terminal switching element $Ncon1$ is connected to a second inductor $Li2$ of the plurality of second inductors $Li2$ that is located at an opposite end of the plurality of second inductors $Li2$ and to the second output terminal 51. The second positive-negative switching unit 5 further includes a diode $Dcon11$ disposed in parallel with the second positive terminal switching element $Pcon1$ and a diode $Dcon12$ disposed in parallel with the second negative terminal switching element $Ncon1$.

The direct-current power supply 3 is connected to the second positive terminal switching element $Pcon1$ and the second negative terminal switching element $Ncon1$. The control unit 6 controls on-off timing of all the switching elements.

In cases where each of the above-mentioned plural switching elements includes a diode, no diode may be disposed in parallel with the switching element. If the switching element includes the diode, that diode is used in place of the diode disposed in parallel with the switching element. In cases where, for example, metal-oxide-semiconductor field-effect transistors realize the switching elements, diodes may be included in the switching elements.

Figure 2:
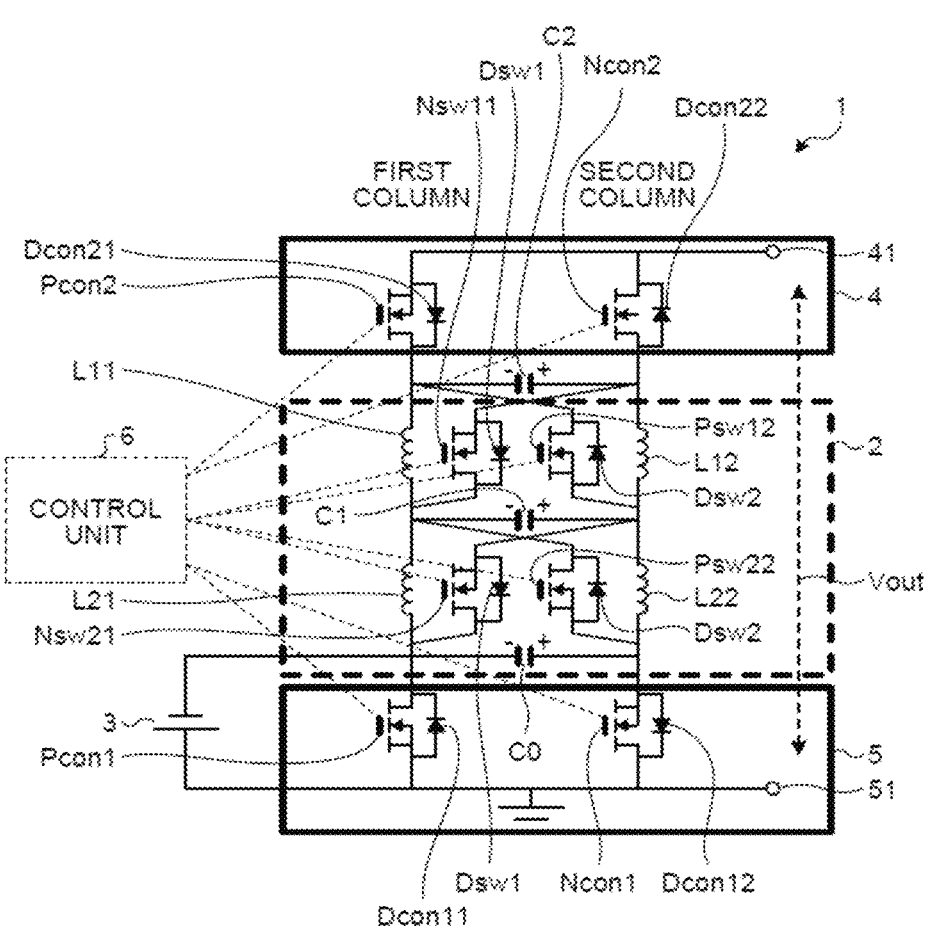
FIG. 2 is a diagram illustrating a configuration of the pulsed power supply apparatus that is used in describing operation of the pulsed power supply apparatus according to the first embodiment.

Next, a description is provided of how the pulsed power supply apparatus 1 operates. FIG. 2 is a diagram illustrating a configuration of the pulsed power supply apparatus 1 that is used in describing the operation of the pulsed power supply apparatus 1 according to the first embodiment. Hereinafter, assume that i is 1. The pulse generation unit 2 includes a capacitor $C0$, a capacitor $C1$, and a capacitor $C2$.

The pulse generation unit 2 further includes an inductor $L11$ and an inductor $L21$ that are connected in series. The inductors $L11$ and $L21$ are examples of the plurality of first inductors $Li1$ connected in series. The pulse generation unit 2 further includes an inductor L12 and an inductor L22 that are connected in series. The inductors L12 and L22 are examples of the plurality of second inductors Li2 connected in series.

The pulse generation unit 2 includes a negative-side switching element Nsw11 and a negative-side switching element Nsw21. The negative-side switching elements Nsw11 and Nsw21 are examples of the plurality of negative-side switching elements Nswi1. The pulse generation unit 2 includes a positive-side switching element Psw12 and a positive-side switching element Psw22. The positive-side switching elements Psw12 and Psw22 are examples of the plurality of positive-side switching elements Pswi2.

Figure 3:
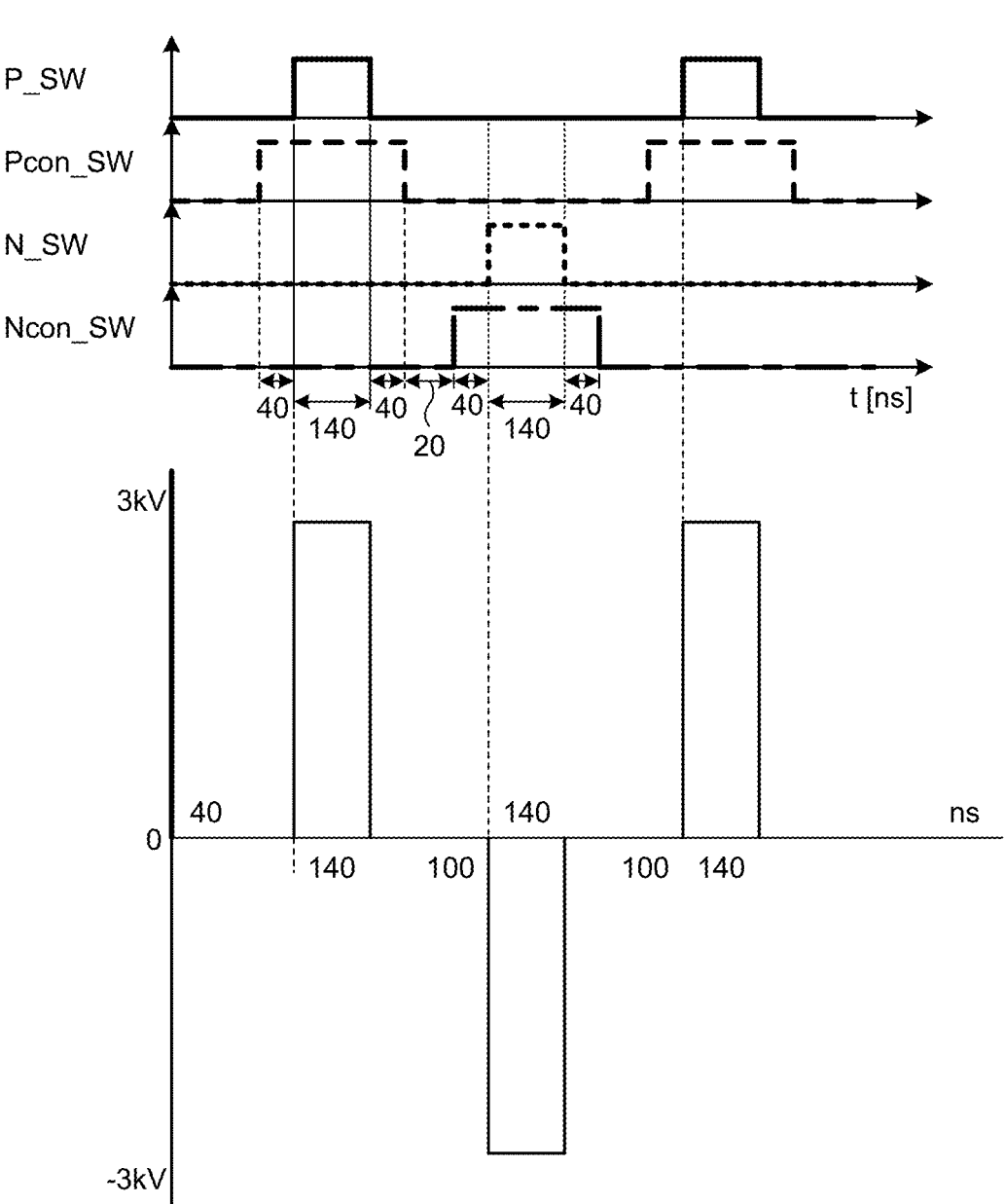
FIG. 3 is a diagram illustrating an example of an operation sequence of a control unit included in the pulsed power supply apparatus according to the first embodiment.

FIG. 3 is a diagram illustrating an example of an operation sequence of the control unit 6 included in the pulsed power supply apparatus 1 according to the first embodiment. In FIG. 3, "P_SW" refers to the positive-side switching elements Psw12 and Psw22, and "Pcon_SW" refers to the first and second positive terminal switching elements Pcon2 and Pcon1. "N_SW" refers to the negative-side switching elements Nsw11 and Nsw21, and "Ncon_SW" refers to the first and second negative terminal switching elements Ncon2 and Ncon1. To begin with, assume that with all the switching elements in an off state, each of the capacitors C0, C1, and C2 is being charged with 1 kV.

The control unit 6 turns on the first positive terminal switching element Pcon2 of the first positive-negative switching unit 4 and the second positive terminal switching element Pcon1 of the second positive-negative switching unit 5 and then turns on the positive-side switching elements Psw12 and Psw22 of the pulse generation unit 2. In this case, a voltage of +3 kV is output between output ends Vout. Next, the control unit 6 turns off the positive-side switching elements Psw12 and Psw22 of the pulse generation unit 2. In this case, the voltage between the output ends Vout becomes 0 V.

Next, the control unit 6 turns off the first positive terminal switching element Pcon2 of the first positive-negative switching unit 4 and the second positive terminal switching element Pcon1 of the second positive-negative switching unit 5 and then turns on the first negative terminal switching element Ncon2 of the first positive-negative switching unit 4 and the second negative terminal switching element Ncon1 of the second positive-negative switching unit 5. The control unit 6 turns on the negative-side switching elements Nsw11 and Nsw21 of the pulse generation unit 2. In this case, a voltage of −3 kV is output between the output ends Vout. Next, the control unit 6 turns off the negative-side switching elements Nsw11 and Nsw21 of the pulse generation unit 2. In this case, the voltage between the output ends Vout becomes 0 V.

Next, the control unit 6 turns off the first negative terminal switching element Ncon2 of the first positive-negative switching unit 4 and the second negative terminal switching element Ncon1 of the second positive-negative switching unit 5. By repeatedly performing the above-described operation, the control unit 6 enables the pulsed power supply apparatus 1 to generate the alternating-current voltage between the output ends Vout.

Selecting elements capable of relatively high speed operation, such as metal-oxide-semiconductor field-effect transistors, as the plural switching elements of pulse generation unit 2 in order to obtain desired pulse widths enables the pulsed power supply apparatus 1 to generate the alternating-current voltage at a higher frequency.

While the pulse generation unit 2 has the three capacitors in the example illustrated in FIG. 2, the voltage can be easily increased by providing as some capacitors, switching elements, and inductors as required for a desired voltage. If there are n capacitors, the voltage generated between the output ends Vout will be an alternating-current voltage of ±charging voltage×n [kV]. n is an integer greater than or equal to 2. The voltage generated between the output ends Vout can be changed by changing the charging voltage of the capacitors.

The control unit 6 may include a state variable observation unit that observes, as state variables, current waveform or voltage waveform between the first output terminal 41 of the first positive-negative switching unit 4 and the second output terminal 51 of the second positive-negative switching unit 5 as well as, for example, command signals output from the control unit 6 respectively to the plural switching elements of the pulsed power supply apparatus 1. The control unit 6 may include a learning device that learns, on the basis of the above state variables, a relationship between the current or voltage waveform between the first and second output terminals 41 and 51 and the command signals output from the control unit 6 respectively to the plural switching elements of the pulsed power supply apparatus 1. The control unit 6 may include a decision-making unit that determines, on the basis of a result of learning, command signals to be output from the control unit 6 respectively to the plural switching elements of the pulsed power supply apparatus 1. By performing machine learning, the control unit 6 is enabled to determine, for example, command signals appropriate to some or all of performance of the switching elements, a load, and connection conditions after a small number of trials. The connection conditions refer to conditions of the connection terminals and wiring.

The control unit 6 may include a trained learning machine that uses the above result of learning. If the control unit 6 has the trained learning machine, a pulsed power supply apparatus different from the pulsed power supply apparatus 1 that has performed the learning is enabled to determine command signals appropriate to some or all of the performance of switching elements, a load, and the connection conditions.

In recent years, development of devices using a new semiconductor material, a silicon carbide semiconductor, has advanced, leading to a situation where higher-voltage and larger-current semiconductor devices are available. Therefore, the pulsed power supply apparatus 1 can be realized using a significantly small number of devices compared to when silicon devices are used.

Figure 4:
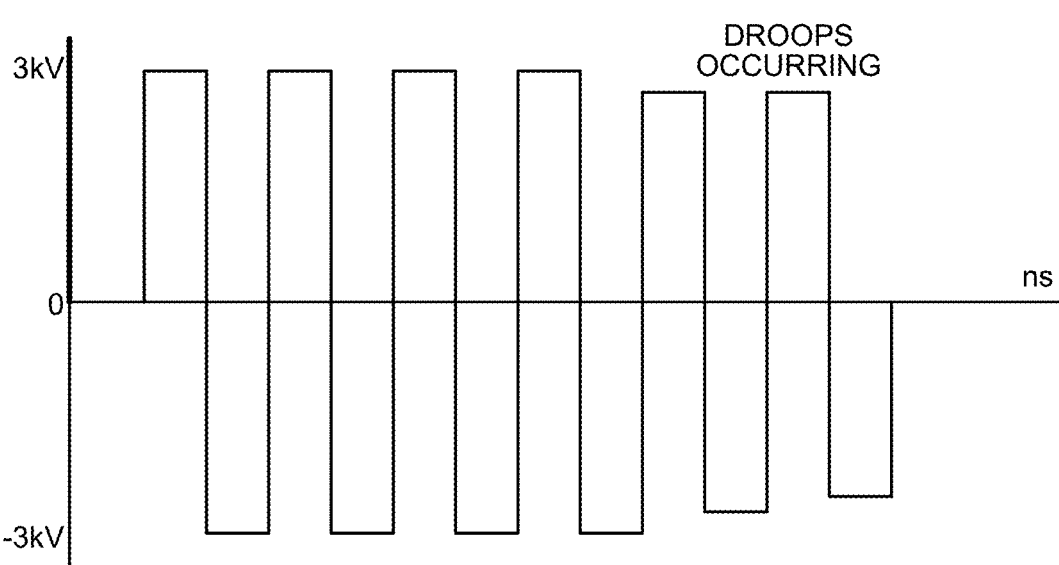
FIG. 4 is a diagram illustrating example output voltage waveforms of the pulsed power supply apparatus according to the first embodiment.

When the output pulse width is relatively long in the order of milliseconds, or when continued pulse driving is performed, droops occur in capacitor voltage, causing the output voltage of the pulsed power supply apparatus 1 to decrease over time, as illustrated in FIG. 4. FIG. 4 is a diagram illustrating example output voltage waveforms of the pulsed power supply apparatus 1 according to the first embodiment. In other words, as current flows from the capacitors to the load, the charging voltage of the capacitors decreases, and the output voltage decreases. To improve a decrease in the output voltage, capacitance of the capacitors needs to be increased. To halve the droop, the capacitance of the capacitors needs to be doubled. If the pulse width is increased by a factor of 1000, the capacitance needs to be increased by a factor of 1000. This means that the capacitance of the capacitors has only to be selected based on the load.

As for the plural switching elements of the pulse generation unit 2, the control unit 6 does not necessarily need to operate every switch simultaneously. The control unit 6 can, at its option, change the output voltage waveform by deliberately changing operation timing.

Therefore, the pulsed power supply apparatus 1 is characteristically less prone to switch failures even if a switch malfunction occurs. The control unit 6 does not need to turn on all the switches. When the switching elements are in the off state, the current flows through the diodes connected in parallel.

Figure 5:
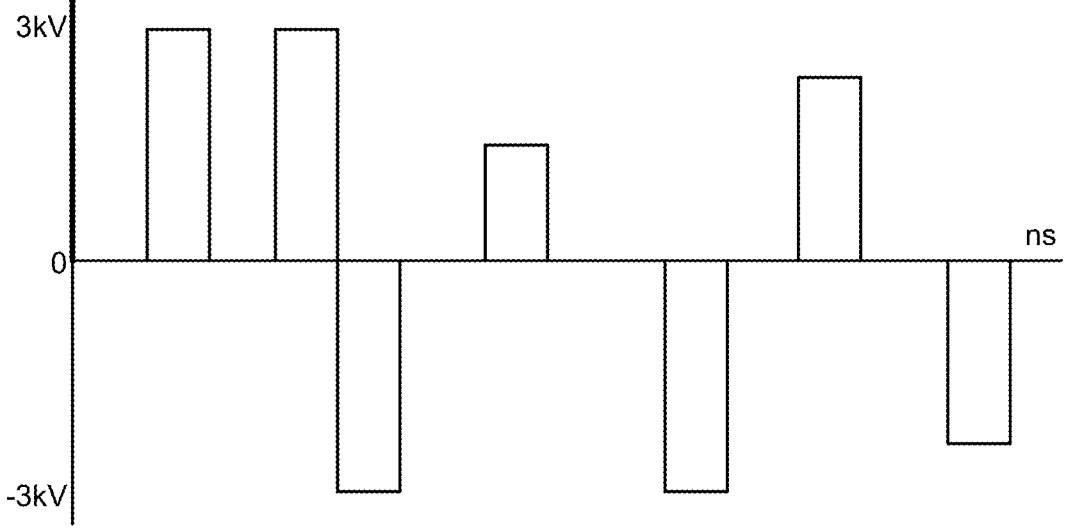
FIG. 5 is a diagram illustrating example output voltage waveforms of the pulsed power supply apparatus according to the first embodiment.

Therefore, by changing the charging voltage, the number of switching elements to be turned on, pulse widths of the switching elements, and the on-off timing for pulses, the pulsed power supply apparatus 1 can shape various output pulses as illustrated in FIG. 5. FIG. 5 is a diagram illustrating the example output voltage waveforms of the pulsed power supply apparatus 1 according to the first embodiment.

As described above, the pulsed power supply apparatus 1 according to the first embodiment is capable of easily generating high-voltage alternating-current pulses. Since the pulsed power supply apparatus 1 is configured with reduced parts count compared to conventional ones, the pulsed power supply apparatus 1 allows for reduced manufacturing costs and contributes to miniaturization. Furthermore, the pulsed power supply apparatus 1 has an effect of generating the bipolar pulsed voltage while being compact.

Second Embodiment

The pulsed power supply apparatus 1 according to the first embodiment is an apparatus that outputs high-voltage pulses by charging the plurality of capacitors in parallel and discharging the plurality of capacitors in series and includes the plurality of first inductors Li1 and the plurality of second inductors Li2 to restrain discharging when the capacitors are connected in series. When the switching elements are in the off state, the charging of the capacitors takes place and takes a certain amount of charging time. Furthermore, since inductance becomes greater downstream, the charging time becomes longer. Therefore, increasing a repetition frequency of high-voltage pulses results in a problem where an absolute value of a peak output voltage becomes smaller than n times an absolute value of the ±charging voltage of direct-current power supply voltage.

Figure 6:
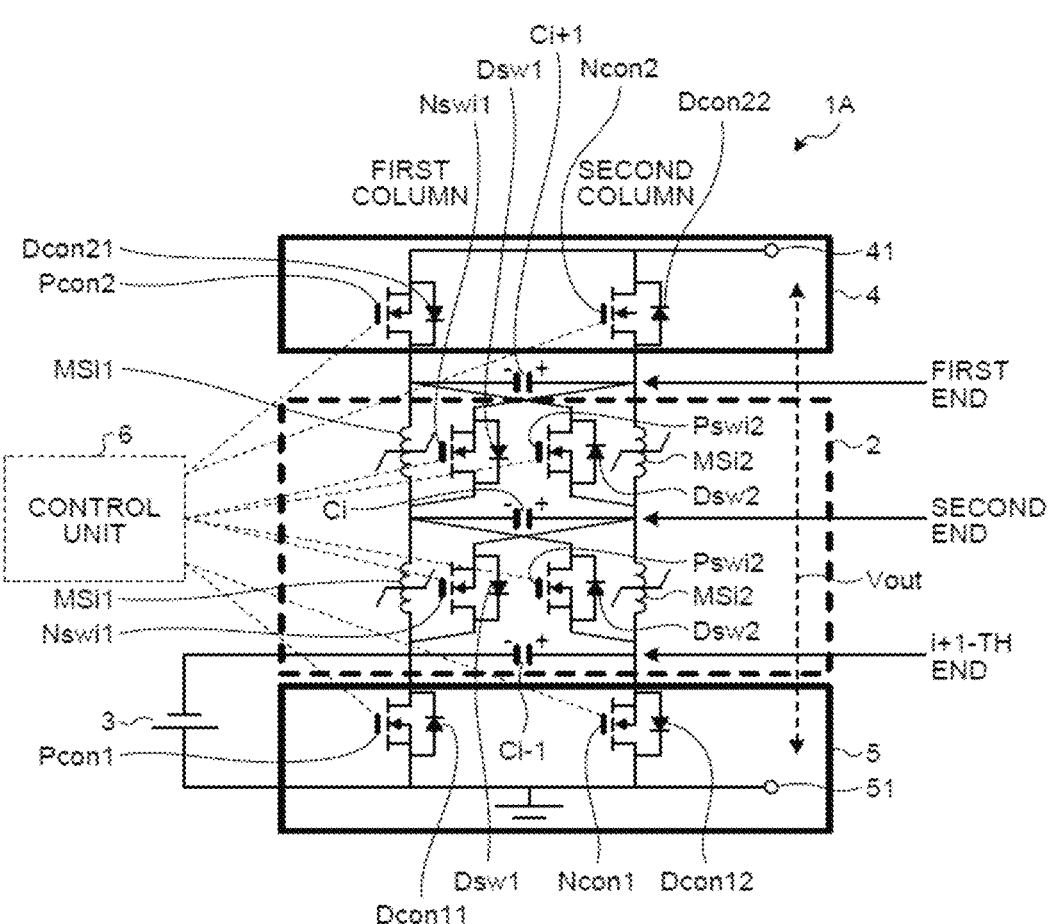
FIG. 6 is a diagram illustrating a configuration of a pulsed power supply apparatus according to a second embodiment.

Accordingly, as illustrated in FIG. 6, a second embodiment has saturable inductors MSi1 in place of the first inductors Li1 of FIG. 1 and saturable inductors MSi2 in place of the second inductors Li2 of FIG. 1. FIG. 6 is a diagram illustrating a configuration of a pulsed power supply apparatus 1A according to the second embodiment. The saturable inductors MSi1 and MSi2 are hereinafter described as "saturable inductors MS". The saturable inductor MS utilizes an extreme difference in permeability between an unsaturated state and a saturated state of a magnetic material to interrupt current with a relative high inductance and allow the current to flow with a relatively low inductance. For example, the saturable inductor MS is realized using a magnetic material with a relatively high permeability, such as a nanocrystalline soft magnetic material.

Figure 7:
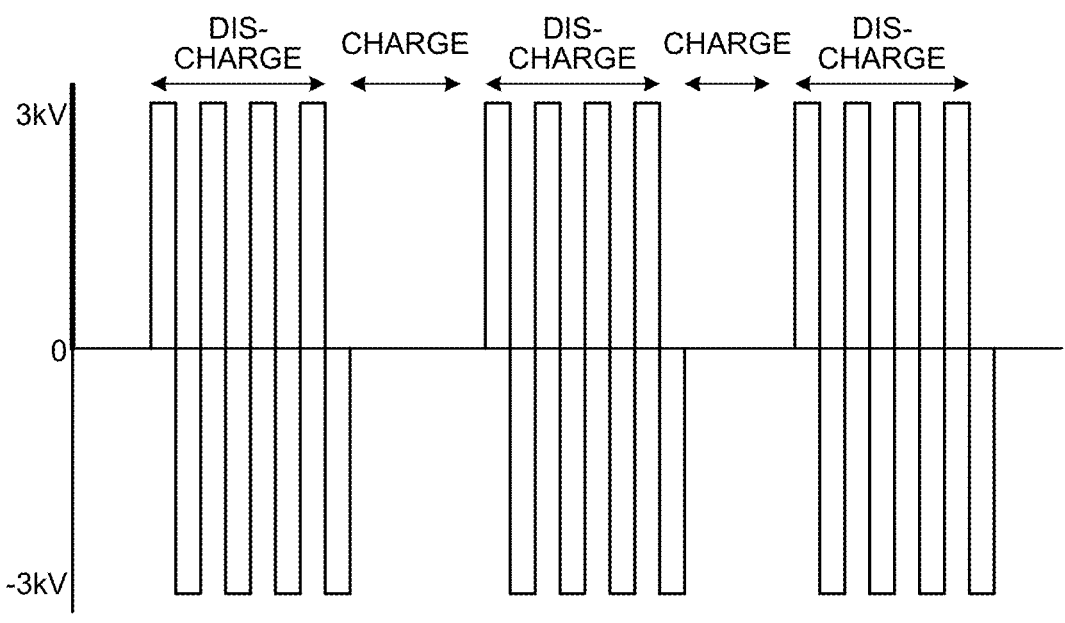
FIG. 7 is a diagram illustrating example output voltage waveforms of the pulsed power supply apparatus according to the second embodiment. 5

When the saturable inductors MS are used, alternating current flows through the inductors during alternating-current pulse driving, so high inductance is maintained without saturation, restraining charging of capacitors and resulting in a discharge operation as illustrated in FIG. 7. On the other hand, without the alternating-current pulse driving, there is a current flow in only one direction for the capacitors to be charged, so the magnetic material of the inductors saturates and becomes almost conductive, causing rapid charging of the capacitors. FIG. 7 is a diagram illustrating example output voltage waveforms of the pulsed power supply apparatus 1A according to the second embodiment.

In this way, the pulsed power supply apparatus 1A according to the second embodiment is capable of outputting stable alternating-current pulses even at an increased repetition frequency of high-voltage pulses.

Figure 8:
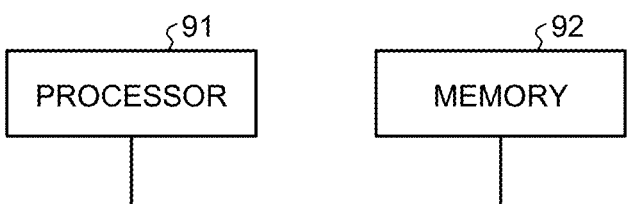
FIG. 8 is a diagram illustrating a processor with which the control unit of the pulsed power supply apparatus according to the first embodiment is implemented.

FIG. 8 is a diagram illustrating a processor 91 with which the control unit 6 of the pulsed power supply apparatus 1 according to the first embodiment is implemented. In other words, the functions of the control unit 6 may be implemented by the processor 91 that executes programs stored in a memory 92. The processor 91 is a central processing unit (CPU), a processing unit, an arithmetic unit, a microprocessor, or a digital signal processor (DSP). The memory 92 is also illustrated in FIG. 8.

In cases where the functions of the control unit 6 are implemented by the processor 91, the functions are implemented with the processor 91 and software, firmware, or a combination of software and firmware. The software or the firmware is described as programs and is stored in the memory 92. The processor 91 reads and executes the programs stored in the memory 92 to implement the functions of the control unit 6.

In cases where the functions of the control unit 6 are implemented with the processor 91, the memory 92 is included in the pulsed power supply apparatus 1 to store the programs with which steps of the control unit 6 are eventually executed. The programs stored in the memory 92 can be said to cause a computer to perform as the control unit 6.

The memory 92 is, for example, a nonvolatile or volatile semiconductor memory such as a random-access memory (RAM), a read-only memory (ROM), a flash memory, an erasable programmable read-only memory (EPROM), or an electrically erasable programmable read-only memory (EEPROM) (registered trademark); a magnetic disk; a flexible disk; an optical disk; a compact disk; a mini disk; a digital versatile disk (DVD); or the like.

Figure 9:
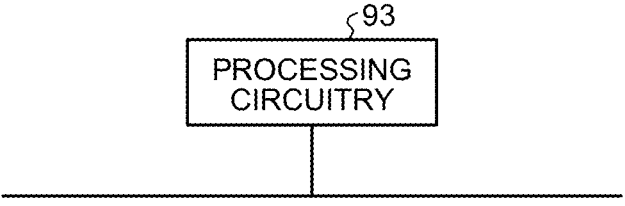
FIG. 9 is a diagram illustrating processing circuitry with which the control unit of the pulsed power supply apparatus according to the first embodiment is implemented.

FIG. 9 is a diagram illustrating processing circuitry 93 with which the control unit 6 of the pulsed power supply apparatus 1 according to the first embodiment is implemented. In other words, the control unit 6 may be implemented with the processing circuitry 93. The processing circuitry 93 is dedicated hardware. The processing circuitry 93 is, for example, a single circuit, a composite circuit, a programmed processor, a parallel programmed processor, an application-specific integrated circuit (ASIC), a field-programmable gate array (FPGA), or a combination of these.

Part of the plural functions of the control unit 6 may be implemented with software or firmware, while a remaining part of the plural functions may be implemented with dedicated hardware. As described above, the plural functions of the control unit 6 are implementable with the hardware, the software, the firmware or a combination of these.

The control unit 6 of the pulsed power supply apparatus 1A according to the second embodiment may be implemented with a processor or processing circuitry. The processor is similar to the above processor 91. The processing circuitry is similar to the above processing circuitry 93.

The above configurations illustrated in the embodiments are illustrative, can be combined with other techniques that are publicly known, and can be partly omitted or changed without departing from the gist. The embodiments can be combined with each other.

REFERENCE SIGNS LIST 1, 1A pulsed power supply apparatus; 2 pulse generation unit; 3 direct-current power supply; 4 first positive-negative switching unit; 5 second positive-negative switching unit; 6 control unit; 41 first output terminal; 51 second output terminal; 91 processor; 92 memory; 93 processing circuitry; Ci−1, Ci, Ci+1, C0, C1, C2 capacitor; Dcon11, Dcon12, Dcon21, Dcon22, Dsw1, Dsw2 diode; Li1 first inductor; Li2 second inductor; L11, L12, L21, L22 inductor; MS saturable inductor; Ncon1 second negative terminal switching element; Ncon2 first negative terminal switching element; Nswi1, Nsw11, Nsw21 negative-side switching element; Pcon1 second positive terminal switching element; Pcon2 first positive terminal switching element; Pswi2, Psw12, Psw22 positive-side switching element; Vout output ends.

The invention claimed is:

1. A pulsed power supply apparatus comprising:
   a plurality of first inductors arranged in a first column in series connection;
   a plurality of second inductors arranged in a second column in series connection;
   a plurality of capacitors;
   a plurality of negative-side switching elements;
   a plurality of positive-side switching elements;
   a first positive terminal switching element connected to a first inductor of the plurality of first inductors that is located at one end of the plurality of first inductors and to a first output terminal;
   a first negative terminal switching element connected to a second inductor of the plurality of second inductors that is located at one end of the plurality of second inductors and to the first output terminal;
   a second positive terminal switching element connected to a first inductor of the plurality of first inductors that is located at an opposite end of the plurality of first inductors and to a second output terminal;
   a second negative terminal switching element connected to a second inductor of the plurality of second inductors that is located at an opposite end of the plurality of second inductors and to the second output terminal; and
   a direct-current power supply connected to the second positive terminal switching element and the second negative terminal switching element, wherein
   an i-th capacitor of the plurality of capacitors is connected to a second end of a first inductor of the plurality of first inductors that is located in an i-th row of the first column and to a second end of a second inductor of the plurality of second inductors that is located in the i-th row of the second column,
   i is an integer greater than or equal to 1,
   an i-th negative-side switching element of the plurality of negative-side switching elements is connected to the second end of the first inductor of the plurality of first inductors that is located in the i-th row of the first column and to a first end of the second inductor of the plurality of second inductors that is located in the i-th row of the second column, and
   an i-th positive-side switching element of the plurality of positive-side switching elements is connected to a first end of the first inductor of the plurality of first inductors that is located in the i-th row of the first column and to the second end of the second inductor of the plurality of second inductors that is located in the i-th row of the second column.

2. The pulsed power supply apparatus according to claim 1, wherein
   each of the plurality of second inductors is a saturable inductor.

\* \* \* \* \*